USO05631565A

United States Patent [19]
Winter

[11] Patent Number: 5,631,565
[45] Date of Patent: May 20, 1997

[54] DEVICE FOR MEASURING RESIDUAL VOLTAGE AND ENERGY IN A PIECE OF EQUIPMENT

[75] Inventor: Robert A. Winter, Sioux Fall, S. Dak.

[73] Assignee: Bowden's Automated Products, Inc., Viborg, S. Dak.

[21] Appl. No.: 659,247

[22] Filed: Jun. 7, 1996

[51] Int. Cl.$^6$ ................................. G01R 31/02
[52] U.S. Cl. ................ 324/511; 324/508; 324/510; 324/771; 340/635
[58] Field of Search ................. 324/508, 509, 324/510, 511, 522, 538, 555, 115, 103 R, 142, 771, 158.1; 340/635, 649, 650, 654, 656; 361/42, 55

[56] References Cited

U.S. PATENT DOCUMENTS

| 3,553,581 | 1/1971 | Tsergas et al. | 324/510 X |
|---|---|---|---|
| 3,648,163 | 3/1972 | Pinner et al. | 324/510 |
| 3,723,863 | 3/1973 | Myers | 324/510 |
| 3,727,123 | 4/1973 | Smith | 324/510 X |
| 3,728,617 | 4/1973 | Potter | 324/510 |
| 3,752,088 | 8/1973 | Ettelman | 324/510 |
| 3,783,340 | 1/1974 | Becker | 324/510 X |
| 3,798,540 | 3/1974 | Darden et al. | 324/510 |
| 3,878,458 | 4/1975 | Muska | 324/508 |
| 4,164,701 | 8/1979 | Gulledge et al. | 324/511 X |
| 5,461,317 | 10/1995 | Winter | 324/511 |
| 5,469,063 | 11/1995 | Winter | 324/508 |

Primary Examiner—Kenneth A. Wieder
Assistant Examiner—Diep Do
Attorney, Agent, or Firm—Patnaude, Videbeck and Marsh

[57] ABSTRACT

A device is provided for measuring the voltage and energy between the contacts of a male connector from a piece of electronic equipment after it has been disconnected for a given period of time from a source of AC power. The device has both a voltage meter and a milli-joules meter which are connected into any one of a series of four circuits. In the first circuit, the meters are connected across the high voltage contact and the low voltage contact of the male connector. In the second circuit, the meters are connected across the high voltage contact and the safety ground, in the third circuit the meters are connected across the low voltage contact and the safety ground, and in the fourth circuit the meters measure the residual voltage and energy between the tip of a conductive probe and safety ground. A control element controls a relay to connect or disconnect the meters into the circuit selected after the piece of equipment being tested has been disconnected from a source of power for a given period of time.

16 Claims, 2 Drawing Sheets

DEVICE FOR MEASURING RESIDUAL VOLTAGE AND ENERGY IN A PIECE OF EQUIPMENT

The present invention relates to a device for measuring the residual voltage and energy across the contacts of a piece of equipment after it has been disconnected from a source of AC power.

BACKGROUND OF THE INVENTION

The medical industry employs numerous pieces of complex electronic equipment which must be operated safely so as not to cause injury to the technicians operating the equipment or to patients with whom it is brought into contact. The International Electro-Technical Commission (IEC) has been formed to establish uniform standards for testing such equipment throughout the European countries, and U.S. manufacturers of electronic equipment for the medical industry who want to sell their products in the European market must determine whether their equipment meets the safety standards as established by the IEC. The IEC 601-1 Universal Medical Equipment Safety Standards, which have recently issued, are currently being adopted by all developed countries of the world, and manufacturers of electronic equipment for the medical industry are in need of a device to carry out certain of the new tests required by these standards.

The new Medical Equipment Safety Testing Standards (IEC Standards) require, among other things, that the voltage between the various connector pins of a male connector for an electronic piece of equipment have a voltage which does not exceed 60 volts when measured one second after being disconnected from a source of AC current the test conducted with an instrument, the internal impedance of which does not affect the test. The standard requires that the test be performed 10 times with a voltage across the connector pins not exceeding 60 volts during any of the 10 measurements. Measurements are to be taken across the high voltage and low voltage pins, across the high voltage and ground pins and across the low voltage and ground pins.

The standards further provide that in the event more than 60 volts remain across any of the pins of a piece of equipment one second after it is disconnected from a source of AC power, the energy stored within the device should be tested by a measurement across the connector pins taken one second after the device is disconnected from a source of AC power, and the stored energy should be less than 2 milli-joules.

The standards also require that live capacitors of a circuit which become accessible after an access cover has been removed shall not have a residual voltage exceeding 60 volts, or if this value is exceeded, not have a residual energy of 2 milli-joules.

Presently, there is no equipment available to undertake the tests to determine whether the standards set by the IEC for a piece of equipment have been met, and manufacturers are manually connecting the appropriate meters across connector pins to determine whether their equipment will meet the standards of the IEC. Therefore, it would be desirable to provide a device capable of measuring the residual voltage and power across the contacts of a piece of equipment after it has been disconnected from a source of AC power in order that it may determine if the device complies with the standards as set by the IEC.

SUMMARY OF THE INVENTION

Briefly, the present invention is embodied in a device for measuring the voltage and energy between the contacts of a male connector from a piece of electronic equipment after it has been disconnected for a given period of time from a source of AC power, where the connector has a high voltage contact and a low voltage contact. The device has a female connector for receiving a male connector having a high voltage contact and a low voltage contact from a piece of equipment to be tested and has a plug or connector for attaching the device to a source of AC power. A first switch selectively connects and disconnects the high voltage contact of the female connector to the high voltage contact of the plug for receiving AC power, thereby connecting or disconnecting the piece of equipment plugged into the female connector of the device to a source of AC power.

In a preferred embodiment, the device has both a voltage meter and a milli-joules meter which are connected into any one of a series of four circuits. In the first circuit, the meters are connected across the high voltage contact and the low voltage contact of the female connector. In the second circuit, the meters are connected across the high voltage contact in the safety ground of the female connector. In the third circuit, the meters are connected across the low voltage contact and the safety ground, and in the fourth circuit, the meters are connected to measure the voltage and energy difference between the tip of a conductive probe and safety ground. A relay selectively connects and disconnects the meters into the circuit selected by the second switch.

The device further has a control element, which may be a microprocessor, and includes a timing device. The control element is responsive to the actuation of the first switch and is connected to the relay for switching the relay to connect or disconnect the meters into the circuit selected by the second switch after the first switch has disconnected the high voltage contact of the female connector from a source of power for a given period of time.

In the preferred embodiment, the first switch is actuated by the control element, and the control element also has a detector for determining when peak voltage is being applied to the high voltage contact of the female connector. The control element actuates the first switch to disconnect the high voltage contact of the female connector from the source of electrical energy when the AC voltage is at a peak. The control element will thereafter actuate the relay to connect the voltage and milli-joules meters into the circuit selected by the second switch after a given period of time, as for example, after one second, or such other period of time as is determined by the timing element. A third switch is also connected to the control element which, when closed, causes the control element to initiate the test sequence described above.

To test a piece of equipment with the device of the present invention, the plug or male connector of a piece of equipment to be tested is inserted into the female connector of the present invention, and the male connector of the test device is inserted into an outlet of AC current. The second switch is adjusted to select one of the four circuits. When the third switch is closed, the control element will disconnect the application of AC power to the female connector and, after one second, the control element will actuate the relay to connect the meters into the circuit and measure the voltage and residual power across the elements which the circuit is configured to test. In testing a piece of equipment, the residual voltage and energy should be tested for each of the four circuits of the selector switch.

The IEC standards require that the voltage test be performed 10 times and that the voltage across the high voltage and low voltage contacts of the connector not exceed 60 volts in any of the 10 tests. Representatives on behalf of the IEC have acknowledged that the purpose of performing the test 10 times is to obtain the highest readings of voltage and residual energy, and I have found that when AC power is repeatedly applied and disconnected from such a piece of equipment, such readings can vary widely because the energy being applied to a device from a source of AC power, by definition, is continually variable. I have also found, however, that the highest readings of residual voltage and energy occur when the tested device is disconnected from a source of AC power when the maximum voltage is applied across the high voltage and low voltage contacts. Representatives of IEC have acknowledged that the standards could be modified to accept a single reading from a test device which would measure residual voltage and power after the device is disconnected from a source of AC power at the instant peak power is applied to the contacts. It is believed that the IEC will accept a single test of the piece of equipment where the test is administered using a device in accordance with the present invention as sufficient to determine whether the device meets the IEC medial equipment safety test standards recently adopted.

GENERAL DESCRIPTION OF THE DRAWINGS

A better and more complete understanding of the present invention will be had from a reading of the following detailed description taken in conjunction with the accompanying drawings wherein:

FIG. 1 is an isometric view of a test device in accordance with the present invention, and FIG. 2 is a schematic diagram of the circuit of the test device shown in FIG. 1.

DETAILED DESCRIPTION OF A PREFERRED EMBODIMENT

Figure 1:
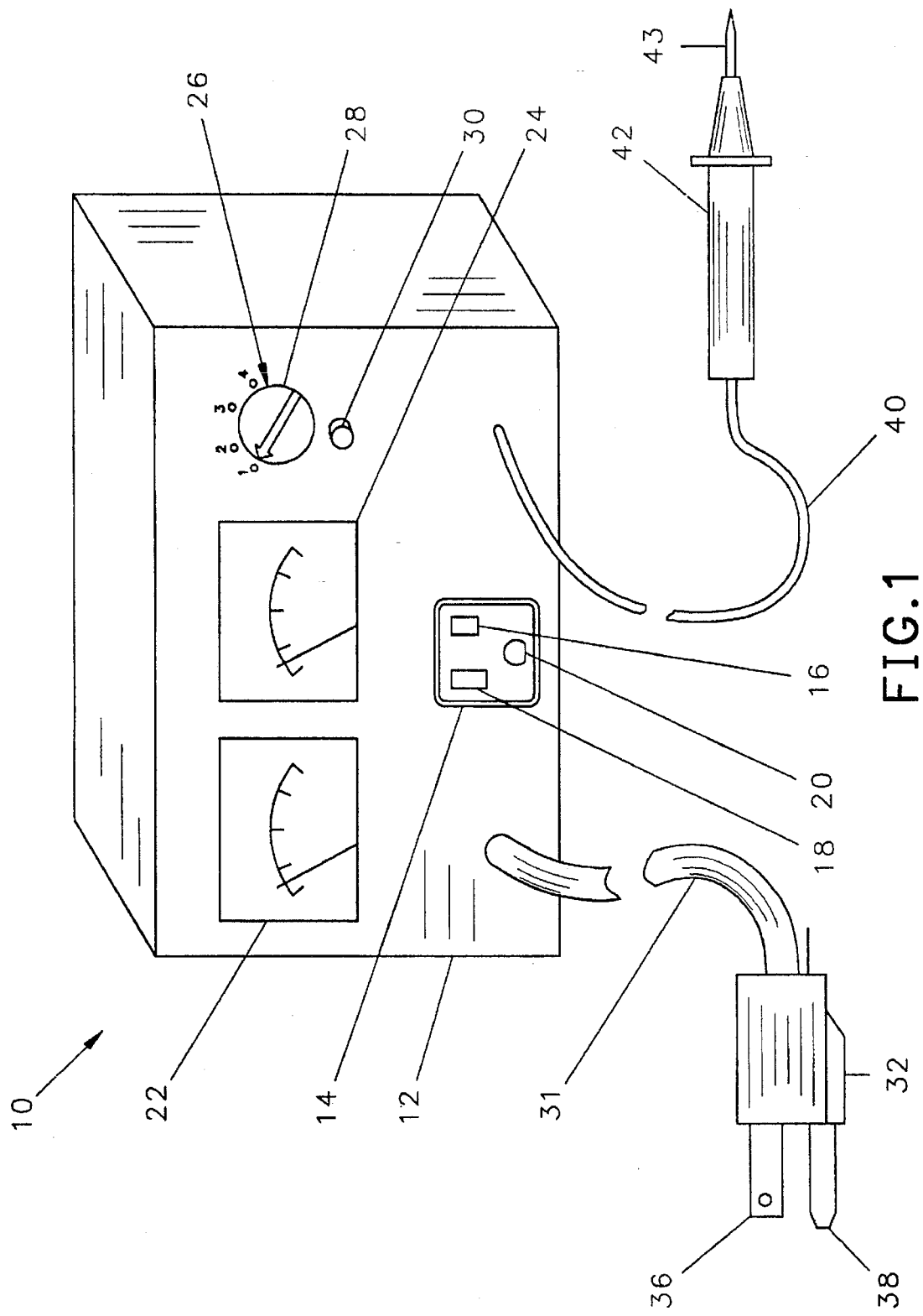

Referring to FIG. 1, a test device 10 in accordance with the present invention has an enclosure 12 and a female AC connector 14 having a high voltage contact 16, a low voltage contact 18, and a safety ground contact 20. The forward surface of the device further has a voltage readout 22, a milli-joules readout 24, and a rotatable selector switch 26 having a control knob 28 which can be adjusted to any of four settings marked 1, 2, 3 and 4. The operation of the device is commenced by the pressing of a test button 30, and the device is connected by a flexible power line 31 to a typical male AC connector 32 having a high voltage contact 34, a low voltage contact 36 (shown only in FIG. 2), and a safety ground contact 38 for connecting the device to a source of AC power. Also extending from the enclosure 12 is a second conductive wire 40 terminating in a probe 42 having an electrically conductive tip 43.

Figure 2:
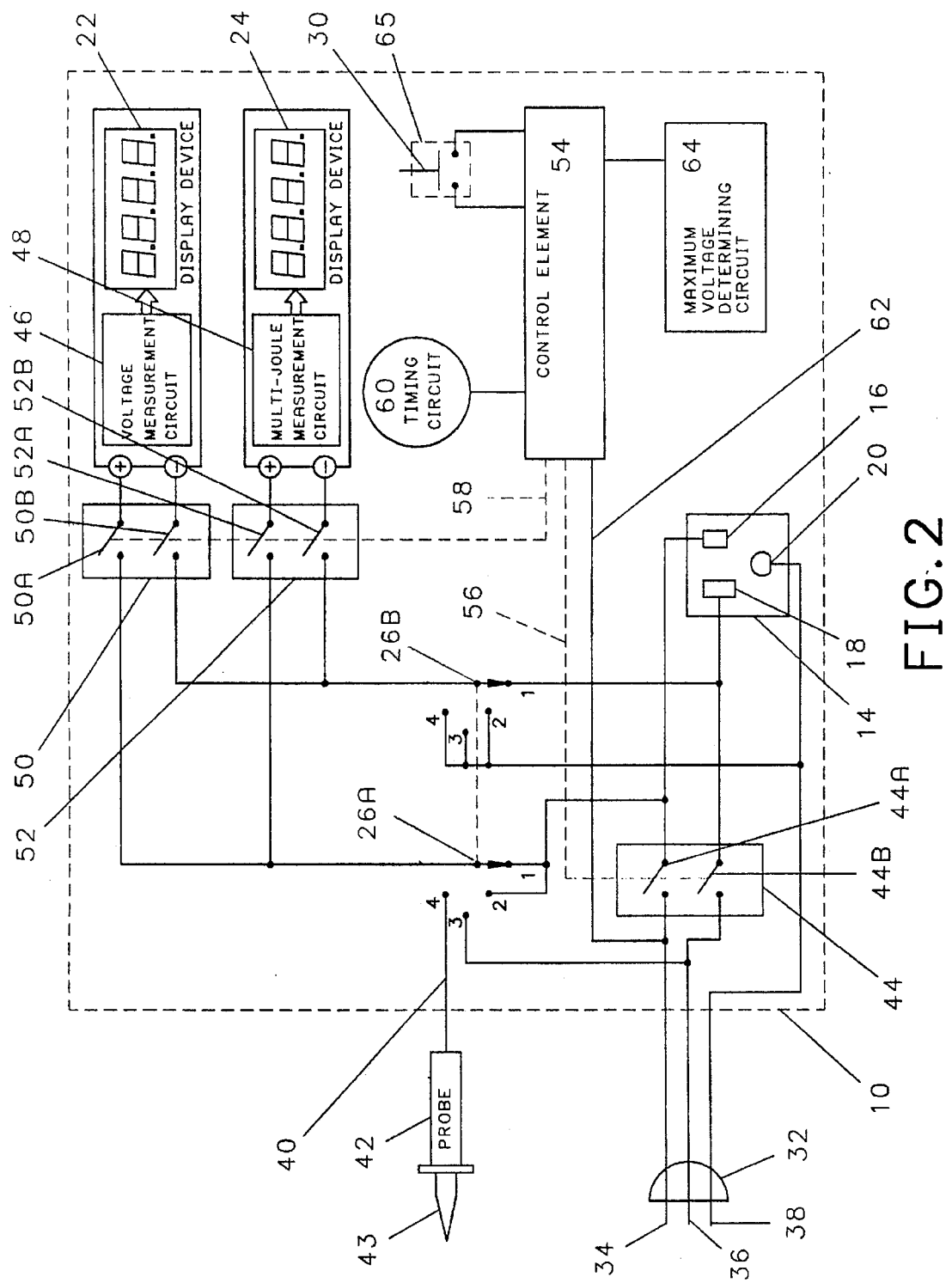

Referring to FIG. 2, the high voltage contact 34 and low voltage contact 36 of the male connector 32 are each connected through an electronically operated double pole relay 44 to the high voltage contact 16 and the low voltage contact 18, respectively, of the female connector 14 with switch 44A of the relay connecting or disconnecting the high voltage contacts 34, 16, respectively, and switch 44B connecting or disconnecting the low voltage contacts 36, 18, respectively. When the relay 44 is not actuated, the switches 44A and 44B are in the closed condition and AC power received by the contacts of the male connector 32 is conveyed to the corresponding contacts of the female connector 14.

The voltage across the various contacts is measured by a typical voltage measuring circuit 46, the output of which is connected to the voltage readout 22, and similarly, the energy output across the various contacts is measured by a typical milli-joules measuring circuit 48, the output of which is connected to the milli-joules readout 24. The voltage measuring circuit 46 is connected or disconnected from the circuit by a second double pole electronically operated relay 50, having switches 50A, 50B which connect or disconnect the two sides of the voltage measuring circuit 46 to the center poles of the first and second wipers 26A, 26B, respectively, of the rotatable switch 26. Similarly, a third double pole electronically operated relay has switches 52A and 52B, respectively, which connect or disconnect the two ends of the milli-joules measuring circuit 48 to the center poles of wipers 26A and 26B, respectively. When the relays 50, 52 are not actuated, the contacts of the switches 50A, 50B, 52A, 52B are in the opened condition, and the measuring circuits 46, 48 are disconnected from wipers 26A and 26B.

The wipers 26A, 26B of the rotatable switch 26 each have four stationary contacts numbered 1–4, respectively, which correspond to the positions numbers 1 to 4 of the knob 28, and the wipers 26A and 26B are ganged together on a common shaft to which the knob 28 is connected for simultaneous operation. When the wipers 26A, 26B are in the first position, the voltage and milli-joules measuring circuits 46, 48, respectively, are connected across the high voltage contact 16 and the low voltage contact 18 of the female connector 14. When the wipers 26A, 26B are in the second position, the measuring circuits 46, 48 are connected across the high voltage contact 16 and the safety ground contact 20 of the female connector 14. When the wipers 26A, 26B are in the third position, the measuring circuits 46, 48 are connected across the low voltage contact 18 and the safety ground contact 20 of the female connector 14, and when the wipers 26A, 26B are in the fourth position, the measuring circuits 46, 48 are connected to measure voltage and milli-joules between the conductive tip 43 of the probe 42 and the safety ground contact 38 of the male connector 32.

The device 10 further has a suitable control element 54, which may be in the form of a microprocessor, which has a first output line 56 for actuating the relay 44 and thereby opening the switches 44A, 44B and a second output line 58 for actuating the second and third relays 50, 52, respectively, and thereby closing the switches 50A, 50B, 52A, 52B. Connected to the control element 54 is a timing circuit 60 for measuring a predetermined length of time, such as one second. The control element 54 is also connected by a synchronization line 62 to the high voltage contact 34 of the male connector 32, and within the control element 54 is a maximum voltage determining circuit 64. The function of the control element 54 is commenced by a switch 65 which is closed by depressing the test initiation button 30.

Accordingly, when the male connector 32 of the device is inserted into an electrical outlet which is a source of AC current and the male connector of a piece of equipment to be tested is inserted into the female connector 16, the AC power applied to the contacts of the male connector 32 is applied through the female connector 14 to the device being tested. The control element 54 is configured to respond to the closing of the switch 65 by issuing a signal through output line 56 to the first relay 44 to open the switches 44A, 44B when the AC voltage applied to the high voltage connector is at a peak thereby disconnecting the high voltage contact and low voltage contact of the piece of equipment being tested from the source of electrical power. Then, after a delay for the interval of time determined by the timing circuit 60, the control element directs a signal through output line 58 to the second and third relays 50, 52 to close switches 50A, 50B, 52A, 52B and connect the voltage measuring circuit 46 and milli-joules measuring circuit 48 across the contacts to be tested. The outputs from the measuring circuits 46, 48 are then displayed on the associated display devices 22, 24, respectively.

After the test has been conducted with the circuit configured in accordance with one of the settings 1, 2, 3 or 4 of the wipers 26A, 26B, the knob 28 can be rotated to move the wipers 26A, 26B to a second position, and thereafter when the button 30 again is depressed again closing switch 65, a second test will be conducted.

The conductive tip 43 of the probe can be used to test the conductive portion of the housing of a piece of electronic equipment or test a capacitor accessible within the equipment to be tested upon opening the enclosure to determine the residual voltage and energy therein. This test is conducted by contacting the end of the probe 42 to a contact of a capacitor while the wipers 26A, 26B are rotated to the fourth position. It should be appreciated that although the control element 54 is described as a microprocessor, integrated circuits are available for detecting the peak voltage of AC current, and such circuits can be combined with a commonly known timing circuit 60 to open switches 44A, 44B of the first relay 44 when peak power is being applied to the high voltage contact, and to close the second and third relays 50, 52 after a given interval of time. A microprocessor as previously described would then not be required.

While the present invention has described in connection with one embodiment, it will be understood that many changes and modifications thereof may be made without departing from the true spirit and scope of the present invention. It is therefore, intended by the appended claims to cover all such changes and modifications which come within the true spirit and scope of the invention.

What is claimed:

1. A device for measuring the voltage between the contacts of a male connector of a piece of electronic equipment after it has been disconnected from a source of AC power for a given period of time, said male connector having a high voltage contact and a low voltage contact, said device comprising in combination:

female connector means having a high voltage contact and a low voltage contact for receiving a high voltage contact and a low voltage contact of a male connector from a piece of equipment, means for connecting said device to a source of AC current, said means for connecting including a high voltage connector means and a low voltage connector means, switch means for selectively connecting and disconnecting said high voltage connector means to said high voltage contact of said female connector means, voltage measuring means, relay means for selectively connecting and disconnecting said voltage measuring means across said high voltage contact and said low voltage contact of said female connector means, timing means for measuring a given period of time, control means responsive to said timing means and said switch means and connected to said relay means for switching said relay means to connect said voltage measuring means across said high voltage contact and said low voltage contact after said switch means has disconnected said high voltage connector means from said high voltage contact of said female connector means for said given period of time.

2. A device in accordance with claim 1 and further comprising display means for displaying an output of said voltage measuring means.

3. A device in accordance with claim 1 and further comprising:

electric energy measuring means, and said relay means for selectively connecting and disconnecting both said voltage measuring means and said electric power measuring means across said high voltage contact and said low voltage contact of said female connector means.

4. A device in accordance with claim 1 and further comprising:

means for detecting peak voltage across said high voltage connector means and said low voltage connector means, and said control means responsive to said means for detecting peak voltage.

5. A device in accordance with claim 4 wherein said switch means is actuated in response to a signal from said control means.

6. A device for measuring the voltage between the contacts of a male connector of a piece of electronic equipment after it has been disconnected from a source of AC power for a given period of time, said male connector having a high voltage contact and a low voltage contact, said device comprising in combination:

female connector means having a high voltage contact and a low voltage contact for receiving a high voltage contact and a low voltage contact of a male connector from a piece of equipment, means for connecting said device to a source of AC current, said means for connecting including a high voltage connector means and a low voltage connector means, first switch means for selectively connecting and disconnecting said high voltage connector means to said high voltage contact of said female connector means, voltage measuring means, first circuit means for connecting said voltage measuring means across said high voltage contact and said low voltage contact of said female connector means, second circuit means for connecting said voltage measuring means between said high voltage contact and a safety ground, third circuit means for connecting said voltage measuring means between said low voltage contact and a safety ground, second switch means for selectively connecting one of said first circuit means, said second circuit means and said third circuit means, relay means between said second switch means and said voltage measuring means for selectively connecting and disconnecting said voltage measuring means to said second switch means, timing means, control means responsive to said timing means and said first switch means and connected to said relay means for switching said relay means to connect said voltage measuring means to said second switch means after said first switch means has disconnected said high voltage connector means from said high voltage contact of said female connector means for a given period of time.

7. A device in accordance with claim 6 and further comprising:
   a conductive probe,
   fourth circuit means for connecting said voltage measuring means between said conductive probe and a safety ground, and
   said second switch means for selectively connecting one of said first circuit means, said second circuit means, said third circuit means and said fourth circuit means.

8. A device for measuring the residual electric energy stored between the contacts of a male connector of a piece of electronic equipment after it has been disconnected from a source of AC power for a given period of time, said male connector having a high voltage contact and a low voltage contact, said device comprising in combination:
   female connector means having a high voltage contact and a low voltage contact for receiving a high voltage contact and a low voltage contact of a male connector from a piece of equipment,
   means for connecting said device to a source of AC current, said means for connecting including a high voltage connector means and a low voltage connector means,
   switch means for selectively connecting and disconnecting said high voltage connector means to said high voltage contact of said female connector means,
   electric energy measuring means,
   relay means for selectively connecting and disconnecting said electric energy measuring means across said high voltage contact and said low voltage contact of said female connector means,
   timing means for measuring a given period of time,
   control means responsive to said timing means and said switch means and connected to said relay means for switching said relay means to connect said electric energy measuring means across said high voltage contact and said low voltage contact after said switch means has disconnected said high voltage connector means from said high voltage contact of said female connector means for said given period of time.

9. A device in accordance with claim 8 and further comprising display means for displaying an output of said electric energy measuring means.

10. A device in accordance with claim 8 and further comprising:
    voltage measuring means, and
    said relay means for selectively connecting and disconnecting both said electric energy measuring means and said voltage measuring means across said high voltage contact and said low voltage contact of said female connector means.

11. A device in accordance with claim 8 and further comprising:
    means for detecting peak voltage across said high voltage connector means and said low voltage connector means, and
    said control means responsive to said means for detecting peak voltage.

12. A device in accordance with claim 11 wherein said switch means is actuated in response to a signal from said control means.

13. A device for measuring the residual electric energy stored between the contacts of a male connector of a piece of electronic equipment after it has been disconnected from a source of AC power for a given period of time, said male connector having a high voltage contact and a low voltage contact, said device comprising in combination:
    female connector means having a high voltage contact and a low voltage contact for receiving a high voltage contact and a low voltage contact of a male connector from a piece of equipment,
    means for connecting said device to a source of AC current, said means for connecting including a high voltage connector means and a low voltage connector means,
    first switch means for selectively connecting and disconnecting said high voltage connector means to said high voltage contact of said female connector means,
    electric energy measuring means,
    first circuit means for connecting said electric energy measuring means across said high voltage contact and said low voltage contact of said female connector means,
    second circuit means for connecting said electric energy measuring means between said high voltage contact and a safety ground,
    third circuit means for connecting said electric energy measuring means between said low voltage contact and a safety ground,
    second switch means for selectively connecting one of said first circuit means, said second circuit means and said third circuit means,
    relay means between said second switch means and said electric energy measuring means for selectively connecting and disconnecting said electric energy measuring means to said second switch means,
    timing means,
    control means responsive to said timing means and said first switch means and connected to said relay means for switching said relay means to connect said electric energy measuring means to said second switch means after said first switch means has disconnected said high voltage connector means from said high voltage contact of said female connector means for a given period of time.

14. A device in accordance with claim 13 and further comprising:
    a conductive probe,
    fourth circuit means for connecting said electric energy measuring means between said conductive probe and a safety ground, and
    said second switch means for selectively connecting one of said first circuit means, said second circuit means, said third circuit means and said fourth circuit means.

15. A device for measuring the voltage and stored electric energy between the contacts of a male connector of a piece of electronic equipment after it has been disconnected from a source of AC power for a given period of time, said male connector having a high voltage contact and a low voltage contact, said device comprising in combination:
    female connector means having a high voltage contact and a low voltage contact for receiving a high voltage contact and a low voltage contact of a male connector from a piece of equipment,
    means for connecting said device to a source of AC current, said means for connecting including a high voltage connector means and a low voltage connector means, first switch means for selectively connecting and disconnecting said high voltage connector means to said high voltage contact of said female connector means, voltage measuring means, electric energy measuring means, first circuit means for connecting said voltage measuring means and said electric energy measuring means across said high voltage contact and said low voltage contact of said female connector means, second circuit means for connecting said voltage measuring means and said electric energy measuring means between said high voltage contact and a safety ground, third circuit means for connecting said voltage measuring means and said electric energy measuring means between said low voltage contact and a safety ground, second switch means for selectively connecting one of said first circuit means, said second circuit means and said third circuit means, relay means between said second switch means and both said voltage measuring means and said electric energy measuring means for selectively connecting and disconnecting said voltage measuring means and said electric energy measuring means to said second switch means, timing means, control means responsive to said timing means and said first switch means and connected to said relay means for switching said relay means to connect said voltage measuring means and said electric energy measuring means to said second switch means after said first switch means has disconnected said high voltage connector means from said high voltage contact of said female connector means for a given period of time.

16. A device in accordance with claim 15 and further comprising:

a conductive probe, fourth circuit means for connecting said voltage measuring means and said electric energy measuring means between said conductive probe and a safety ground, and said second switch means for selectively connecting one of said first circuit means, said second circuit means, said third circuit means and said fourth circuit means.

* * * * *